(12) United States Patent
Wilson et al.

(10) Patent No.: US 9,151,788 B2
(45) Date of Patent: Oct. 6, 2015

(54) TRANSFORMER WINDING RESISTANCE TESTER TEST PROBE AND METHOD

(71) Applicant: Liebert Corporation, Columbus, OH (US)

(72) Inventors: James C. Wilson, Marietta, GA (US); Robert Ross, Lone Jack, MO (US)

(73) Assignee: Electrical Reliability Services, Inc., Westerville, OH (US)

( * ) Notice: Subject to any disclaimer, the term of this patent is extended or adjusted under 35 U.S.C. 154(b) by 312 days.

(21) Appl. No.: 13/733,558

(22) Filed: Jan. 3, 2013

(65) Prior Publication Data

US 2013/0169298 A1 Jul. 4, 2013

Related U.S. Application Data

(60) Provisional application No. 61/582,848, filed on Jan. 4, 2012.

(51) Int. Cl.
*G01R 27/08* (2006.01)
*G01R 31/02* (2006.01)
*G01R 31/34* (2006.01)
*G01R 1/067* (2006.01)
*G01R 31/06* (2006.01)

(52) U.S. Cl.
CPC .............. *G01R 27/08* (2013.01); *G01R 31/027* (2013.01); *G01R 1/06788* (2013.01); *G01R 31/06* (2013.01); *G01R 31/346* (2013.01)

(58) Field of Classification Search
USPC ............................ 324/546, 547, 715; 439/187
See application file for complete search history.

(56) References Cited

U.S. PATENT DOCUMENTS

| 2,539,271 | A |   | 1/1951 | Rianda |
| 3,670,287 | A | * | 6/1972 | Keto ................................ 439/39 |
| 4,008,943 | A | * | 2/1977 | Flatt et al. ....................... 439/185 |
| 5,105,158 | A | * | 4/1992 | Fiedziuszko et al. .......... 324/693 |
| 5,491,424 | A | * | 2/1996 | Asar et al. ...................... 324/715 |
| 5,666,058 | A |   | 9/1997 | Wakamatsu |
| 6,452,396 | B2 |  | 9/2002 | Ott et al. |
| 6,841,986 | B1 |  | 1/2005 | Tannehill |
| 6,927,598 | B2 |  | 8/2005 | Lee et al. |

(Continued)

OTHER PUBLICATIONS

Electrical Conductivity; adinstruments.com website, original date unknown.

(Continued)

*Primary Examiner* — Melissa Koval
*Assistant Examiner* — Stephen G Armstrong
(74) *Attorney, Agent, or Firm* — Harness, Dickey & Pierce, P.L.C.

(57) ABSTRACT

A test probe has a probe portion, a current source lead attachment portion and a voltage sense lead attachment portion. The test probe includes two conductive halves secured together with an electrically insulating material disposed between the halves electrically insulating them from each other. Each half has an "L" shape including a probe portion and a test lead attachment portion extending perpendicularly outwardly from the probe portion, and provides the test probe with an overall "T" shape. The conductive halves can be made of copper-beryllium. Methods of providing and using the test probe can include uncoupling a male coupling member of a power cable connector of a loadbreak bushing assembly from a female coupling member of the loadbreak bushing and inserting the rod-shaped probe portion into the female coupling member.

20 Claims, 3 Drawing Sheets

(56) References Cited

U.S. PATENT DOCUMENTS

| | | |
|---|---|---|
| 7,106,076 B2 * | 9/2006 | Tillmann et al. .............. 324/715 |
| 7,503,785 B2 | 3/2009 | Stepniak |
| 7,648,376 B1 | 1/2010 | Borgstrom |
| 2002/0164896 A1 | 11/2002 | Borgstrom et al. |
| 2010/0022111 A1 | 1/2010 | Borgstrom |

OTHER PUBLICATIONS

Standard Earth rods kit 3P method (50m), von Testoon; usinenouvelle.com website, original date unknown.

AEMC 6470-B Digital Ground Tester 150ft Kit; test-equipment.com website, original date unknown.

Hook Test Conn Ins Piercing Blk—Xel Blk—Test and Work Bench Equipment; es.digikey.com website, original date unknown.

* cited by examiner

TRANSFORMER WINDING RESISTANCE TESTER TEST PROBE AND METHOD

CROSS-REFERENCE TO RELATED APPLICATIONS

This application claims the benefit of U.S. Provisional Application No. 61/582,848, filed on Jan. 4, 2012. The entire disclosure of the above application is incorporated herein by reference.

FIELD

The present disclosure relates to test probes and methods for transformer winding resistance testers for transformers having loadbreak bushings.

BACKGROUND

This section provides background information related to the present disclosure which is not necessarily prior art.

High voltage transformers in electrical distribution systems typically have loadbreak connectors connecting high voltage cables to the transformers. The loadbreak connectors have loadbreak bushings. In transformers having loadbreak bushings, it is difficult to obtain accurate and consistent transformer winding resistance test results. Most transformer winding resistance testers have a current source output and a separate voltage sense input to measure the resistance of the transformer winding only and ignores the resistance of the test probes.

When measuring the winding resistance of a transformer having loadbreak bushings, a conductive rod of some type, such as a ½ inch diameter rod, must be inserted into the bushing to make contact with the conductive portion of the bushing. This adds to the resistance of the test probe. This can introduce an unknown factor and error to the resistance test results due to the differences in resistivity of the materials of which the conductive rod can be made. The conductive rod can be made of any conductive material such as copper, steel or aluminum. Each of these materials has different resistivity and will therefore introduce an unknown amount of error to the winding resistance measurement. This invention will practically eliminate error introduced by the test probe.

SUMMARY

This section provides a general summary of the disclosure, and is not a comprehensive disclosure of its full scope or all of its features.

In accordance with aspects of the present disclosure, a test probe has a probe portion, a current source lead attachment portion and a voltage sense lead attachment portion. The test probe includes two conductive halves secured together with an electrically insulating material disposed between the halves electrically insulating them from each other. In an aspect, the conductive halves are made of copper-beryllium.

In aspects, the test probe 100 may be "T" shaped with each half being "L" shaped having a probe portion and a test lead attachment portion extending perpendicularly outwardly from the probe portion. The test lead attachment portion of one of conductive halves provides the current source lead attachment portion of the test probe and the test lead attachment portion of the other of the conductive halves provides the voltage sense lead attachment portion of the test probe.

In accordance with other aspects of the present disclosure, a method of testing a winding resistance of a transformer having a loadbreak bushing includes providing a test probe comprising a rod-shaped probe portion comprising a first conductive portion that is electrically insulated from a second conductive portion. The rod-shaped portion is provided with an overall diameter that corresponds to a diameter of a male connector member of a power cable connector that cooperates with a female connector of the loadbreak bushing. A current source lead is electrically coupled between the first conductive portion and a resistance tester. A voltage sense lead is electrically coupled between the second conductive portion and the resistance tester.

In other aspects, a method includes uncoupling a male coupling member of a power cable connector of a loadbreak coupling assembly from a female coupling member of the loadbreak bushing and inserting the rod-shaped probe portion into the female coupling member.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Example embodiments will now be described more fully with reference to the accompanying drawings.

Figure 1:
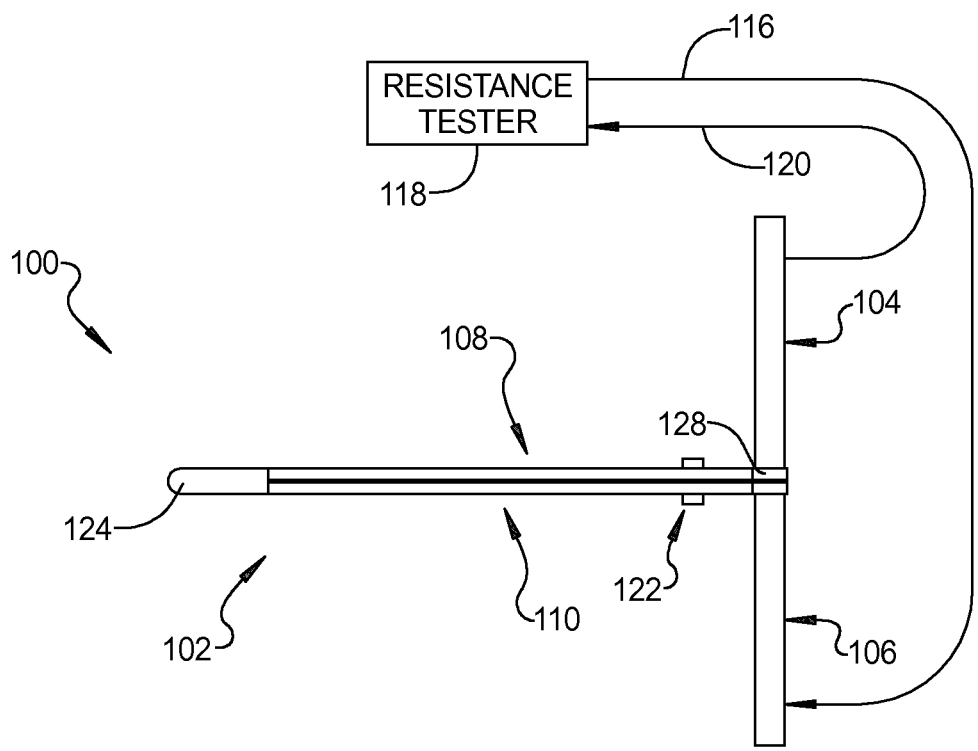
FIG. 1 is a perspective view of a test probe in accordance with an aspect of the present disclosure.
Figure 2:
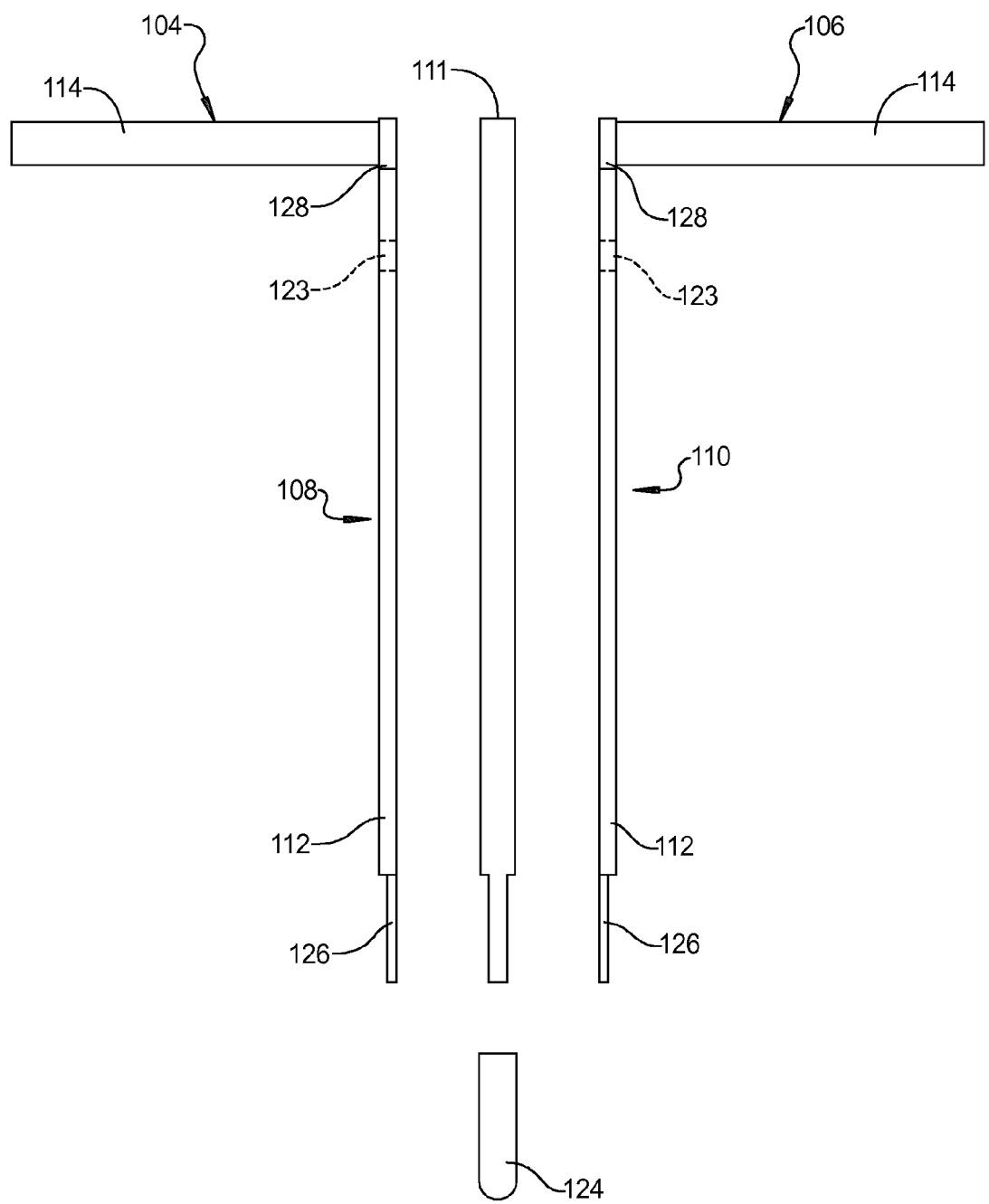
FIG. 2 is an exploded assembly view of the test probe of FIG. 1.

With reference to the drawings, in accordance with an aspect of the present disclosure, a test probe 100 has a probe portion 102, current source lead attachment portion 104 and voltage sense lead attachment portion 106. Test probe 100 includes two conductive halves 108, 110 secured together with an electrically insulating material 111 disposed between halves 108, 110 electrically insulating them from each other. Test probe 100 may be "T" shaped with each half 108, 110 being "L" shaped having a probe portion 112 and a test lead attachment portion 114 extending perpendicularly outwardly from probe portion 112. The test lead attachment portion 114 of one of conductive halves 108, 110 (half 108 as shown in FIGS. 1 and 2) is for attachment to a current source lead 116 (FIG. 1) of a transformer winding resistance tester 118 and provides current source lead attachment portion 104 of test probe 100. The test lead attachment portion 114 of the other of conductive halves 108, 110 (half 110 as shown in FIGS. 1 and 2) is for attachment to a voltage sense lead 120 of transformer winding resistance tester 118 and provides voltage sense lead attachment portion 106 of test probe 100. Each conductive half 108, 110 may illustratively be made of copper-beryllium.

Conductive halves 108, 110 may be secured together such by an insulated nut and screw arrangement 122 close to a junction 128 of probe portions 112 and test lead attachment portions 114 of conductive halves 108, 110. Electrically insulating tip 124 may illustratively be secured over ends 126 of probe portions 112 of conductive halves 108, 110 and holds conductive halves 108, 110 together at ends 126. When conductive halves 108, 110 are secured together, probe portions 112 of conductive halves 108, 110 provide probe portion 102 of test probe 100.

Figure 3:
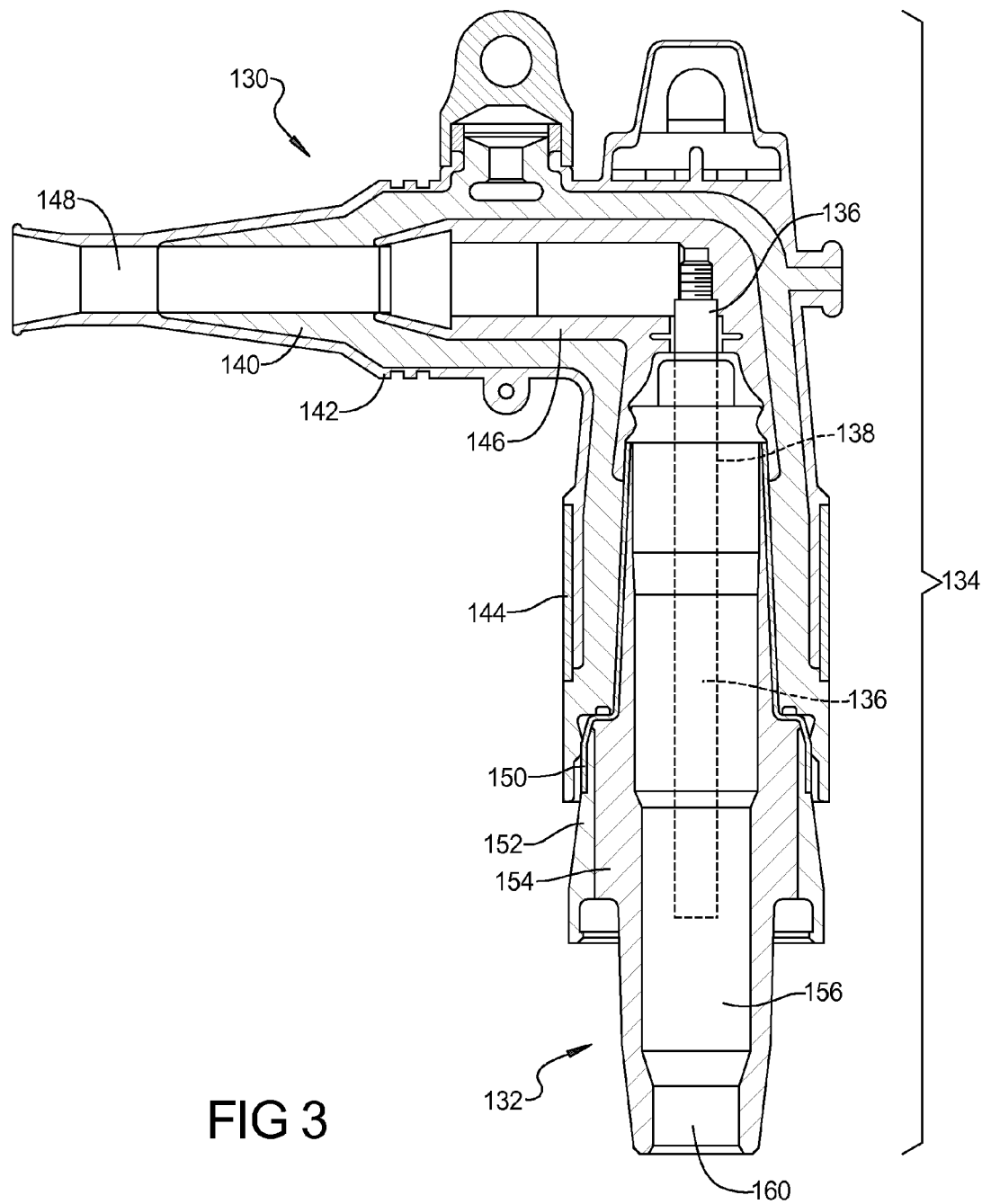
FIG. 3 is a cross-sectional view of a loadbreak connector assembly, including a loadbreak bushing and a power cable connector.

Referring FIG. 3, an exemplary loadbreak connector assembly 134 is illustrated. Loadbreak connector assembly 134 is comprised of a power cable connector 130 and a loadbreak bushing 132. Power cable connector 130 can be comprised of various insulating and conductive components, including 136, 140, 142, 144, and 146, which electrically couple a power cable 148 to a power cable coupling member 136. In this case, the power cable coupling member is a male coupling member 136 in the form of an elongate rod.

Loadbreak bushing 132 is similarly made up of various electrically insulating and coupling components, including 150, 152, 154, and 156, which electrically couple transformer windings 160 to cooperating coupling member 138. In this case, cooperating coupling member 138 of loadbreak bushing 132 is a female coupling member 138, in the form of an elongate bore.

Methods of testing a winding resistance of a transformer having a loadbreak bushing should be apparent from the above discussion. For example, such methods can include, providing test probe 100 comprising a rod-shaped probe portion 102 including first conductive portion 108 that is electrically insulated from second conductive portion 110. For example, an electrically insulating material 111 can be positioned between the two conductive halves 108, 110. Rod-shaped portion 102 can be provided with an overall cross-sectional diameter that corresponds to a cross-sectional diameter of male connector member 136 of a power cable connector 130 that cooperates with female connector member 138 of the loadbreak bushing 132.

Current source lead 116 can be electrically coupled to first conductive portion 108. Voltage sense lead 120 can be electrically coupled to second conductive portion 110. For example, current source lead 116 can be electrically coupled to first conductive portion 108 via coupling to current source lead attachment portion 104. Similarly, voltage source lead 120 can be electrically coupled to second conductive portion 110 of voltage sense lead conductive portion 106.

Such methods can also include providing probe portions 112 of each of the first and second conductive portions 108, 110 as elongate members having a semi-circular cross-sectional shape. Test probe 100 can also be provided with current source lead attachment portion 104 extending from a proximal end of first conductive portion 108 and providing test probe 100 with voltage sense lead attachment portion 106 extending from a proximal end of second conductive portion 110. Current source lead attachment portion 104 can be provided to extend away from voltage sense lead attachment portion 106.

Such methods can additionally include forming at least the first and second conductive probe portions 112 of test probe 100 from a copper-beryllium material. An electrically insulating material 111 can also be secured between the first and second conductive portions 112. Nonconductive fastener (e.g., nut and screw arrangement 122) can be provided through aligned openings 123 adjacent a proximal end of each of the first and second conductive probe portions 112 respectively. Insulating tip 124 can be provided surrounding a distal end of rod-shaped probe portion 112 to coupling distal end of first conductive half 108 to a distal end of second conductive half 110.

Related methods can also include uncoupling a male coupling member 136 of power cable connector 130 from female coupling member 138 of loadbreak bushing 132. Then, rod-shaped probe portion 120 can be inserted into female coupling member 136, which can be an elongated bore.

Figure 4:
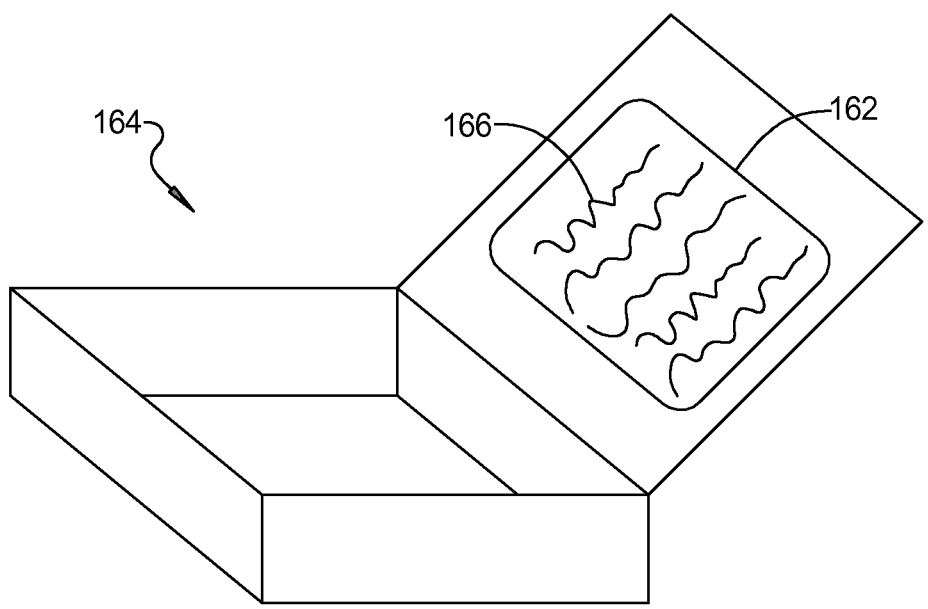
FIG. 4. is a perspective view of a package for the test probe of FIG. 1.

Referring to FIG. 4, indicia 166 can be provided instructing a user to insert rod-shaped probe portion 102 into female conductor 138 of loadbreak bushing 132. For example, indicia 166 can be printed on a package 164 or a package label 162. As another example, the tester package 164 can include a printed package insert or pamphlet providing indicia 166. Alternatively, indicia 166, including instructions and information can be provided separate from any package 164. For example, indicia 166 providing such instructions and information can be provided via a website or advertising materials, including product brochures and pamphlets. Indicia 166 can be textual, graphical, or both.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A loadbreak bushing test probe for testing a transformer winding resistance comprising:
    a rod-shaped probe portion comprising a first conductive half coupled to a second conductive half with an electrically insulating material disposed between the conductive halves and insulating the conductive halves from each other;
    a current source lead attachment portion coupled to and extending from a first end of the first conductive half of the rod-shaped probe portion;
    a voltage sense lead attachment portion coupled to and extending from a first end of the second conductive half of the rod-shaped probe portion; and
    an insulating tip surrounding a distal end of the first conductive half and a distal end of the second conductive half;
    wherein the rod-shaped probe portion has a diameter that substantially corresponds to a diameter of a female connecter of the loadbreak bushing.

2. The loadbreak bushing test probe according to claim 1, wherein the current source lead attachment portion and the voltage sense lead attachment portion extend away from each other.

3. The loadbreak bushing test probe according to claim 1, wherein the current source lead attachment portion and the voltage sense lead attachment portion extend away from each other and in a common plane.

4. The loadbreak bushing test probe according to claim 1, wherein the current source lead attachment portion and the voltage sense lead attachment portion extend perpendicular to the rod-shaped probe portion and away from each other in a common plane such that the test probe has an overall T-shaped configuration.

5. The loadbreak bushing test probe according to claim 1, wherein at least the first and second conductive halves of the rod-shaped probe portion are comprised of copper-beryllium.

6. The loadbreak bushing test probe according to claim 1, further comprising a current source lead electrically coupled to the current source lead attachment portion and a voltage sense lead electrically coupled to the voltage sense lead attachment portion.

7. The loadbreak bushing test probe according to claim 1, further comprising a non-conductive screw passing through aligned apertures in the first and second conductive halves respectively, and a nut threaded onto the non-conductive screw.

8. The loadbreak bushing test probe according to claim 7, wherein the insulating tip operates to couple the distal end of the first conductive half to the distal end of the second conductive half.

9. A method of testing a winding resistance of a transformer having a loadbreak bushing comprising:
providing a test probe comprising a rod-shaped probe portion comprising a first conductive portion that is electrically insulated from a second conductive portion;
providing the rod-shaped portion with an overall diameter that corresponds to a diameter of a male connector member of a power cable connector that cooperates with a female connector of the loadbreak bushing;
electrically coupling a current source lead from a resistance tester to only the first conductive portion; and
electrically coupling a voltage sense lead from the resistance tester to only the second conductive portion.

10. The method according to claim 9, further comprising providing indicia instructing a user to insert the rod-shaped probe portion into the female connector of the loadbreak bushing.

11. The method according to claim 9, wherein providing the test probe comprises providing each of the first and second conductive portions as elongated members having a semi-circular cross-sectional shape.

12. The method according to claim 9, further comprising providing the test probe with a current source lead attachment portion extending from a proximal end of the first conductive portion, and providing the test probe with a voltage sense lead attachment portion extending from a proximal end of the second conductive portion, wherein the current source lead attachment portion extends away from the voltage sense lead attachment portion; and wherein electrically coupling the current source lead to the first conductive portion comprises coupling the current source lead to the current source lead attachment portion, and wherein electrically coupling the voltage sense lead to the second conductive portion comprises coupling the voltage sense lead to the voltage sense lead attachment portion.

13. The method according to claim 9, further comprising forming at least the first and second conductive portions of the test probe from a copper-beryllium material.

14. The method according to claim 9, wherein providing the test probe further comprises securing an electrically insulating material between the first and second conductive portions.

15. The method according to claim 9, wherein providing the test probe further comprises providing a nonconductive fastener through aligned openings adjacent a proximal end of the each of the first and second conductive portions respectively, and providing an insulating tip surrounding a distal end of the rod-shaped probe portion to couple a distal end of the first conductive portion to a distal end of a second conductive portion.

16. A method of testing a winding resistance of a transformer having a loadbreak bushing comprising:
providing a test probe comprising a rod-shaped probe portion comprising a first conductive portion that is electrically insulted from a second conductive portion
electrically coupling a current source lead to the first conductive portion;
electrically coupling a voltage sense lead to the second conductive portion;
uncoupling a male coupling member of a power cable connector from a female coupling member of the loadbreak bushing; and
inserting the rod-shaped probe portion into the female coupling member.

17. The method according to claim 16, wherein providing the test probe further comprises providing each of the first and second conductive portions as elongated members having a semi-circular cross-sectional shape comprising the rod-shaped probe portion.

18. The method according to claim 16, further comprising providing the test probe with a current source lead attachment portion extending from a proximal end of the first conductive portion, and providing the test probe with a voltage sense lead attachment portion extending from a proximal end of the first conductive portion, wherein the current source lead attachment portion extends away from the voltage sense lead attachment portion; and wherein electrically coupling the current source lead to the second conductive portion comprises coupling the current source lead to the current source lead attachment portion, and wherein electrically coupling the voltage sense lead to the second conductive portion comprises coupling the voltage sense lead to the voltage sense lead attachment portion.

19. The method according to claim 16, further comprising forming at least the first and second conductive portions of the test probe from a copper-beryllium material.

20. The method according to claim 16, wherein providing the test probe further comprises: securing an electrically insulating material between the first and second conductive portions; providing a nonconductive fastener through aligned openings adjacent a proximal end of the each of the first and second conductive portions respectively; and providing an insulating tip surrounding a distal end of the rod-shaped probe portion to couple a distal end of the first conductive portion to a distal end of the second conductive portion.

* * * * *